US007218660B2

(12) United States Patent
Koelle et al.

(10) Patent No.: US 7,218,660 B2
(45) Date of Patent: May 15, 2007

(54) SINGLE-MODE VERTICAL CAVITY SURFACE EMITTING LASERS AND METHODS OF MAKING THE SAME

(75) Inventors: Bernhard Ulrich Koelle, San Jose, CA (US); Scott W. Corzine, Sunnyvale, CA (US); Laura Giovane, Santa Clara, CA (US); An-Nien Chang, San Jose, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 354 days.

(21) Appl. No.: 10/694,290

(22) Filed: Oct. 27, 2003

(65) Prior Publication Data

US 2005/0089074 A1    Apr. 28, 2005

(51) Int. Cl.
*H01S 5/00*    (2006.01)
*H01S 3/08*    (2006.01)

(52) U.S. Cl. .............................. 372/50.121; 372/46.01; 372/96

(58) Field of Classification Search .............. 372/46.01, 372/50.124, 92, 98, 99
See application file for complete search history.

(56) References Cited

U.S. PATENT DOCUMENTS

| 5,256,596 | A | * | 10/1993 | Ackley et al. ................. 438/39 |
| 5,328,854 | A | * | 7/1994 | Vakhshoori et al. ........... 438/22 |
| 5,387,543 | A | * | 2/1995 | Ackley ......................... 438/41 |
| 5,446,752 | A | * | 8/1995 | Ackley et al. ............ 372/46.01 |
| 5,557,627 | A | * | 9/1996 | Schneider et al. ........ 372/50.12 |
| 5,568,499 | A | * | 10/1996 | Lear ......................... 372/45.01 |
| 5,577,064 | A | * | 11/1996 | Swirhun et al. ............... 372/96 |
| 5,659,568 | A | * | 8/1997 | Wang et al. ................... 372/96 |
| 5,719,893 | A | * | 2/1998 | Jiang et al. ............... 372/50.11 |
| 5,732,103 | A | * | 3/1998 | Ramdani et al. ............... 372/96 |
| 5,745,515 | A | * | 4/1998 | Marta et al. ............ 372/45.013 |
| 5,867,516 | A |   | 2/1999 | Corzine et al. |
| 5,956,364 | A | * | 9/1999 | Jiang et al. .................... 372/96 |
| 5,966,399 | A | * | 10/1999 | Jiang et al. .................... 372/96 |
| 5,995,531 | A | * | 11/1999 | Gaw et al. ...................... 372/96 |
| 6,021,146 | A | * | 2/2000 | Jiang et al. ............. 372/50.124 |
| 6,023,485 | A | * | 2/2000 | Claisse et al. ............ 372/50.21 |
| 6,026,111 | A |   | 2/2000 | Jiang et al. |
| 6,144,682 | A | * | 11/2000 | Sun .......................... 372/45.01 |
| 6,160,830 | A | * | 12/2000 | Kiely et al. ............... 372/46.01 |
| 6,411,638 | B1 |   | 6/2002 | Johnson et al. |
| 6,534,331 | B2 | * | 3/2003 | Liao et al. ..................... 438/46 |

(Continued)

OTHER PUBLICATIONS

Unold et al., "Improving single-mode VCSEL performance by introducing a long monolithic cavity." IEEE Photonics Technology Letters, vol. 12, No. 8, pp. 929-941, Aug. 2000.

(Continued)

*Primary Examiner*—Minsun Oh Harvey
*Assistant Examiner*—Phillip Nguyen

(57) ABSTRACT

In one aspect, a vertical cavity surface emitting laser (VCSEL) is operable to generate single-mode laser light at an operative wavelength. The VCSEL includes a light-emitting surface and a monolithic longitudinal stack structure. The longitudinal stack structure includes a first mirror, a second mirror, and a cavity region. The cavity region is disposed between the first mirror and the second mirror and includes an active light generation region and a cavity extension region. The longitudinal stack structure further includes an ion-implanted current confinement region. A VCSEL array incorporating the above described VCSEL and a method of making the above-described VCSEL also are described.

25 Claims, 3 Drawing Sheets

U.S. PATENT DOCUMENTS

| | | | |
|---|---|---|---|
| 6,567,454 B1 * | 5/2003 | Fischer et al. | 372/68 |
| 6,600,761 B1 * | 7/2003 | Fischer et al. | 372/23 |
| 6,618,414 B1 | 9/2003 | Wasserbauer et al. | |
| 6,628,695 B1 | 9/2003 | Aldaz et al. | |
| 6,639,928 B2 * | 10/2003 | Marion | 372/50.121 |
| 6,639,931 B1 * | 10/2003 | Allen et al. | 372/96 |
| 6,642,070 B2 * | 11/2003 | Jiang et al. | 438/22 |
| 6,658,040 B1 * | 12/2003 | Hu et al. | 372/96 |
| 6,680,963 B2 * | 1/2004 | Liao et al. | 372/96 |
| 6,798,806 B1 * | 9/2004 | Johnson et al. | 372/43.01 |
| 6,852,558 B2 * | 2/2005 | Lee et al. | 438/32 |
| 6,879,612 B1 * | 4/2005 | Wasserbauer | 372/50.1 |
| 6,904,072 B2 * | 6/2005 | Cox et al. | 372/46.01 |
| 2002/0150135 A1 | 10/2002 | Naone et al. | |
| 2003/0091083 A1 * | 5/2003 | Hwang et al. | 372/46 |
| 2003/0185267 A1 * | 10/2003 | Hwang et al. | 372/96 |
| 2004/0013157 A1 * | 1/2004 | Deng et al. | 372/97 |
| 2004/0091011 A1 * | 5/2004 | Liu | 372/46 |
| 2004/0228377 A1 * | 11/2004 | Deng et al. | 372/34 |
| 2005/0047474 A1 * | 3/2005 | Johnson et al. | 372/99 |

OTHER PUBLICATIONS

Deppe et al., "High spatial coherence vertical-cavity surface-emitting laser using a long monolithic cavity," Electronics Letters, vol. 33, No. 3, pp. 211-213 Jan. 30, 1997.

Ha et al., "Determination of cavity loss in proton implanted vertical-cavity surface-emitting lasers," Jpn. J. Appl. Phys., vol. 37, Part 2, No. 4A, L372-L374, Apr. 1998.

Kardosh et al., "Vertical-extended-cavity surface-emitting lasers," Annual Report 2002, Optoelectronics Department, University of Ulm, pp. 1-7, Jan. 2003.

* cited by examiner

SINGLE-MODE VERTICAL CAVITY SURFACE EMITTING LASERS AND METHODS OF MAKING THE SAME

BACKGROUND

A VCSEL is a laser device formed from an optically active semiconductor region that is sandwiched between a pair of highly reflective mirror stacks, which may be formed from layers of metallic material, dielectric material or epitaxially-grown semiconductor material. Typically, one of the mirror stacks is made less reflective than the other so that a portion of the coherent light that builds in a resonating cavity formed between the mirror stacks may be emitted preferentially from one side of the device. Typically, a VCSEL emits laser light from the top or bottom surface of the resonating cavity with a relatively small beam divergence. VCSELs may be arranged in singlets, one-dimensional or two-dimensional arrays, tested on wafer, and incorporated easily into an optical transceiver module that may be coupled to a fiber optic cable.

In general, a VCSEL may be characterized as a gain-guided VCSEL or an index-guided VCSEL. An implant VCSEL is the most common commercially available gain-guided VCSEL. An implant VCSEL includes one or more high resistance implant regions for current confinement and parasitic reduction. An oxide VCSEL, on the other hand, is the most common laterally index-guided VCSEL. An oxide VCSEL includes oxide layers (and possibly implant regions) for both current and optical confinement.

VCSELs and VCSEL arrays have been successfully developed for single-mode operation and multi-mode operation at a variety of different wavelengths (e.g., 650 nm, 850 nm, 980 nm, 1300 nm and 1550 nm).

In general, it is desirable for single-mode VCSELs to exhibit single-mode behavior within a range of specified operating conditions, while complying with other performance specifications. In general, it is desirable to increase the single-mode optical power produced by a VCSEL. In addition, it is desirable to reduce the series resistance of a VCSEL and the divergence of the output optical beam produced by the VCSEL. It also is desirable to reduce the susceptibility of a VCSEL to damage by electrostatic discharge (ESD). In some prior approaches, both high series resistance and low ESD thresholds have been linked to small current apertures.

A high injection current is needed to generate high output power from a VCSEL. A higher injection current, however, causes the output beam to diverge through a well-known beam-steering effect that results from the interaction between the lateral modes of the VCSEL and current-induced changes in the refractive index in the wave guiding structure of the VCSEL. At low injection current, a VCSEL typically operates in the fundamental (i.e., lowest order) lateral mode, and the refractive index in the wave guiding structure remains substantially constant. At higher injection current, however, the mode structure becomes unstable due to ohmic heating and spatial hole burning effects. These changes allow higher order lateral modes to propagate with higher divergence angles, resulting in less efficient coupling between the VCSEL and the associated optical fiber used to transfer light from the VCSEL. For implant VCSELs, the mixing between different lasing modes often is detected as a kink in a graph of optical power plotted as a function of the injection current (often called the "L-I" curve) for the VCSEL.

The size of the current aperture of a VCSEL has been increased to increase the output optical power of the device. A larger current aperture also reduces the series resistance of the VCSEL. Larger current apertures, however, increase the likelihood that higher order lasing modes will propagate and mix with the fundamental mode. Extended cavity structures and optical anti-guiding structures have been introduced into the wave guiding cavities of VCSELs to suppress higher order lasing modes. Oftentimes, the introduction of such structures increases the complexity and reduces the reliability of the VCSEL manufacturing process.

SUMMARY

The invention features single-mode vertical cavity surface emitting lasers and methods of making the same.

In one aspect of the invention, a vertical cavity surface emitting laser (VCSEL) is operable to generate single-mode laser light at an operative wavelength. The VCSEL includes a light-emitting surface and a monolithic longitudinal stack structure. The longitudinal stack structure includes a first mirror, a second mirror, and a cavity region. The first mirror has an optical reflectivity $R_1$ for light at the operative wavelength. The second mirror has an optical reflectivity $R_2$ for light at the operative wavelength, wherein $R_1$ and $R_2$ have different respective values one of which is greater than 99.9% and another of which is less than 99.7%. The cavity region is disposed between the first mirror and the second mirror and includes an active light generation region and a cavity extension region. The longitudinal stack structure further includes an ion-implanted current confinement region that is characterized by a peak longitudinal implant concentration separated from the cavity region by a longitudinal distance greater than 0.5 micrometers.

The invention also features a VCSEL array incorporating the above described VCSEL and a method of making the above-described VCSEL.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

I. Overview of VCSEL Structure

Figure 1:
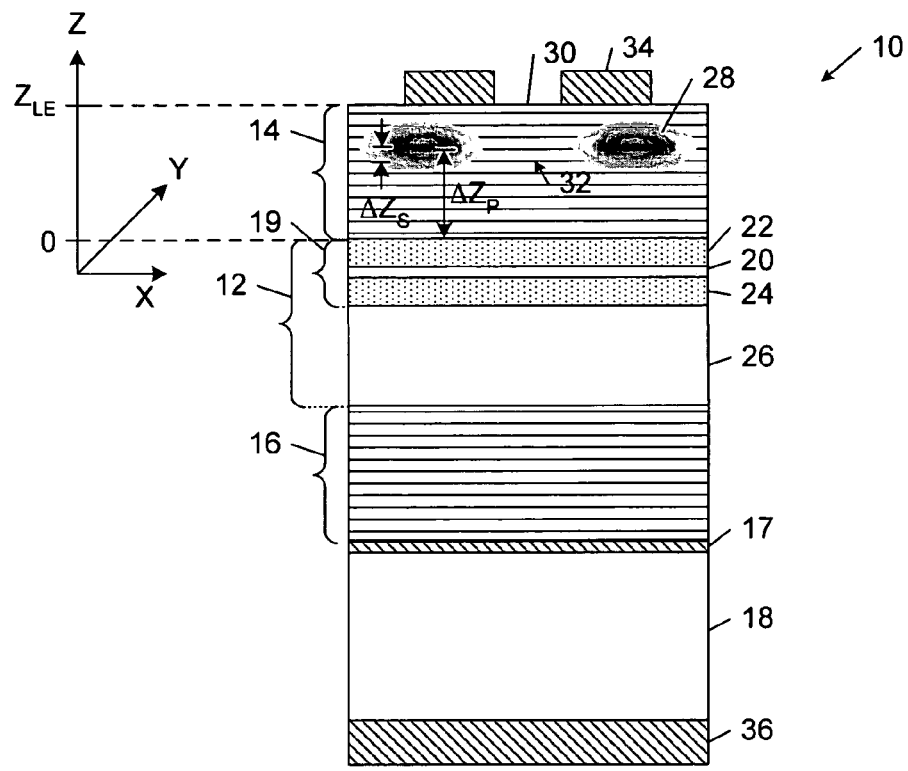
FIG. 1 is a diagrammatic cross-sectional side view of a gain-guided VCSEL that includes an ion-implanted region defining a current aperture and a cavity region disposed between first and second mirrors.

FIG. 1 shows an embodiment of a planar gain-guided VCSEL 10 that is operable to generate single-mode laser light at an operative wavelength (e.g., a wavelength 650 nm, 850 nm, 980 nm, 1300 nm and 1550 nm). As used herein, "single-mode laser light" refers to output light of VCSEL 10 that is characterized by a wavelength spectrum with a single dominant intensity peak with a side mode suppression ratio (SMSR) greater than 30 decibels (dB). The wavelength of the single dominant intensity peak is referred to herein as the "operative wavelength".

VCSEL 10 has a monolithic stack structure extending in a longitudinal (Z) direction that includes a cavity region 12 sandwiched between a first mirror 14 and a second mirror 16. The monolithic stack structure is formed on a substrate 18. An optional buffer layer 17 may be grown between the substrate 18 and the monolithic stack structure. The first and second mirrors 14, 16 are formed of material layers characterized by high electrical conductivity. Cavity region 12 includes an active light generation region 19 and a cavity extension region 26. The active region 19 includes one or more active layers 20 that may include, for example, one or more quantum wells or one or more quantum dots, that are sandwiched between a pair of barrier layers 22, 24. A ring-shaped ion-implanted current confinement region 28 is disposed between a light-emitting surface 30 of VCSEL 10 and the cavity region 12. The current confinement region 28 corresponds to a ring-shaped region of material that has been damaged by ions (i.e., protons) that have been implanted in the layers of first mirror 14. The damage caused by the implanted ions converts the implanted mirror material into a material with a high electrical resistance. The current confinement region 28 surrounds a current aperture 32 that is formed from un-implanted (and, consequently, substantially undamaged) mirror material that substantially retains its original high electrical conductivity. In some implementations, the diameter of the current aperture 32 is about fifteen times the operative wavelength in free space.

A first ring-shaped electrical contact 34 is formed on the light-emitting surface 30. A second electrical contact 36 is located at the opposite end of VCSEL 10. The first and second electrical contacts 34, 36 enable VCSEL 10 to be driven by a suitable driving circuit. In operation, an operating voltage is applied across electrical contacts 34, 36 to produce a current flow in VCSEL 10. In general, current flows through a central region of the VCSEL structure and lasing occurs in a central portion of cavity region 12. The aperture 32 surrounded by ion-implanted region 28 in the first mirror stack 14 laterally confines electrical carriers to the central region of the VCSEL structure. Carrier confinement results from the relatively high electrical resistivity of the confinement region 28, which causes electrical current preferentially to flow through the centrally located aperture 32. The lateral electrical carrier confinement increases the density of electrical carriers within the active region and, consequently, increases the efficiency with which light is generated within the active region. It is believed that the electrical contact 34 acts as an optical loss guiding mechanism so that the aperture in the electrical contact 34 sets the divergence angle of the laser light emitted from VCSEL 10. In some implementations, the diameter of the aperture in electrical contact 34 is smaller than the diameter of the ion-implanted current aperture 32.

In the illustrated embodiment, each of the first and second mirrors 14, 16 includes a system of alternating layers of different refractive index materials that forms a distributed Bragg reflector (DBR) designed for a specified operative laser wavelength (e.g., a wavelength in the range of 650 nm to 1650 nm). For example, first and second mirror stacks 14, 16 may be formed of alternating layers of high aluminum content AlGaAs and low aluminum content AlGaAs. The layers of first and second mirror stacks 14, 16 preferably have an effective optical thickness (i.e., the layer thickness multiplied by the refractive index of the layer) that is about one-quarter of the operating laser wavelength. Substrate 18 may be formed from GaAs, InP, sapphire ($Al_2O_3$), or InGaAs and may be undoped, doped n-type (e.g., with Si) or doped p-type (e.g., with Zn). The mirror located closest to the light-emitting surface 30 is made less reflective than the other mirror so that a portion of the coherent light that builds in cavity region 12 is preferentially emitted through the light-emitting surface 30.

In the embodiments illustrated herein, first and second mirrors 14, 16 are designed so that laser light is emitted from the top surface of VCSEL 10. In other embodiments, the mirror stacks 14, 16 may be designed so that laser light is emitted from the bottom surface of substrate 18.

First and second barrier layers 22, 24 may be formed from materials chosen based upon the material composition of the active layers. In some implementations, active layers 20 and barrier layers 22, 24 may be formed from different respective compositions of AlInGaAs (i.e., AlInGaAs, GaAs, AlGaAs and InGaAs), InGaAsP (i.e., InGaAsP, GaAs, InGaAs, GaAsP, and GaP), GaAsSb (i.e., GaAsSb, GaAs, and GaSb), InGaAsN (i.e., InGaAsN, GaAs, InGaAs, GaAsN, and GaN), or AlInGaAsP (i.e., AlInGaAsP, AlInGaAs, AlGaAs, InGaAs, InGaAsP, GaAs, InGaAs, GaAsP, and GaP). Other quantum well layer compositions also may be used. The cavity extension region 26 is formed of a material that is substantially transparent to light at the operative wavelength and that can be formed monolithically with the other layers of VCSEL 10. In some implementations, the cavity extension region 26 is formed of the same material that is used to form one of the constituent layers of the first and second mirrors 14, 16.

In some implementations, the active region 19 has an optical thickness that is substantially equal to the operative wavelength of VCSEL 10. In these implementations, cavity extension region 26 has an optical thickness in the longitudinal direction (Z) that is substantially equal to an integral multiple of one-half of the operative wavelength of VCSEL 10.

VCSEL 10 may be formed by conventional epitaxial growth processes, such as metal-organic chemical vapor deposition (MOCVD) and molecular beam epitaxy (MBE).

As explained in detail below, various features of VCSEL 10 are selected so that implementations of VCSEL 10 are characterized by relatively high single-mode output optical power, relatively low series resistance, and relatively smooth (non-kinky) L-I curves. In particular, the separation between the ion-implanted region 28 and the cavity region 12, the reflectivity of the light-emission mirror (e.g., first mirror 14 in the embodiment of FIG. 1), and the optical thickness of the cavity extension region 26 are selected to cooperatively obtain improved VCSEL performance with a device characterized by reduced manufacturing complexity and increased manufacturing reliability.

Implant Depth

It has been observed that reducing the depth of the implanted region (i.e., increasing the separation between the ion-implanted region 28 and the cavity region 12) increases the forward leakage current (i.e., the portion of the forward injection current that is not used to generate light) and therefore increases the lasing threshold current level. The resulting L-I curves for such VCSELs, however, have been observed to be less kinky. It is believed that this effect results from better control of the forward injection current at higher current levels. Reducing the depth of the implanted region also improves current uniformity across the cavity 12, reduces current crowding, reduces thermal lensing effects, and reduces the likelihood of implant damage extending to the active layer 20 and adversely affecting device performance.

Figure 2:
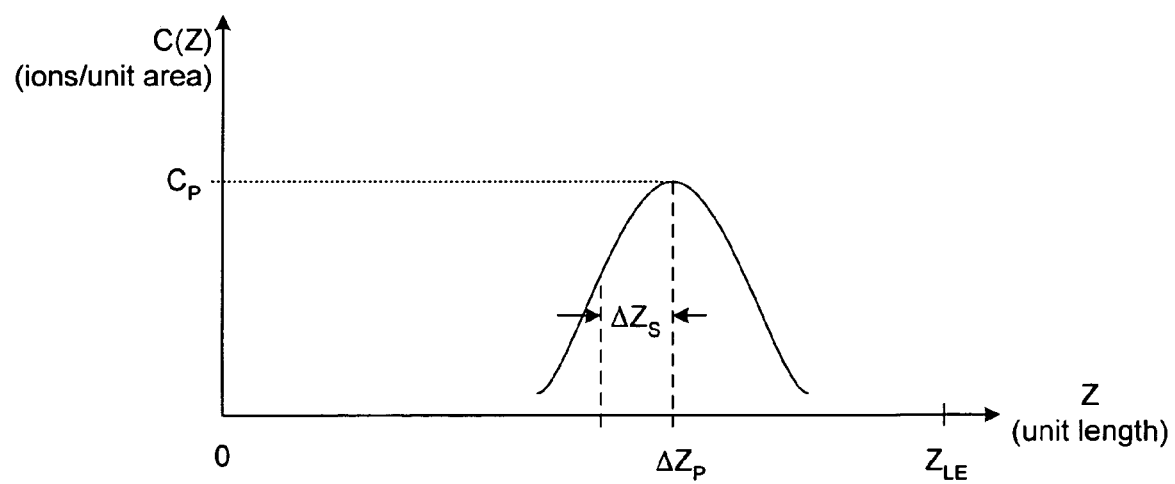
FIG. 2 is a graph of implant concentration plotted as a function of distance from the cavity region for an exemplary implementation of the VCSEL of FIG. 1.

Referring to FIGS. 1 and 2, improved VCSEL performance is achieved by positioning the ion-implanted region between the light-emitting surface 30 and the cavity region 12 at a location where the peak longitudinal implant concentration ($C_P$) is separated from the cavity region 12 by a longitudinal distance $\Delta Z_P$ that is greater than 0.5 micrometers (μm).

In some implementations, the ion-implanted region is positioned between the light-emitting surface 30 and the cavity region 12 at a location where the peak longitudinal implant concentration ($C_P$) is separated from the cavity region 12 by a longitudinal distance $\Delta Z_P$ that is greater than three times the straggle ($\Delta Z_S$) of the ion-implanted region 28. The longitudinal straggle ($\Delta Z_S$) is the standard deviation in the areal concentration of implanted ions about the peak lateral (in the X-Y plane) areal ion concentration. In one formulation, the longitudinal straggle may be computed using equation (1):

$$\Delta Z_S = \sqrt{\frac{1}{\varphi} \int_{-\infty}^{Z_{LE}} (Z - \Delta Z_P)^2 \cdot C(Z) dZ} \quad (1)$$

where $C(Z)$ is the lateral areal concentration of implanted ions (ions per unit area) and $\varphi$ is the ion implantation dose, which is given by equation (2):

$$\varphi = \int_{-\infty}^{Z_{LE}} C(Z) dZ \quad (2)$$

Light Emission Mirror Reflectivity

It has been observed that reducing the reflectivity of the light emission mirror reduces the light generation efficiency of VCSEL 10 by increasing the forward leakage current, increasing the lasing threshold current level. As explained above, however, increasing the lasing threshold current level by increasing the leakage current has been observed to improve the characteristic L-I curve for the VCSEL. In addition, it has been observed that reducing the reflectivity of the light emission mirror in this way increases the single-mode output optical power.

Improved VCSEL performance is achieved by configuring the light emission mirror (e.g., first mirror 14 in VCSEL 10) to have a reflectivity ranging from preferably 99.0–99.9%, and more preferably ranging from 99.3–99.7%, for light at the operative wavelength, and configuring the non-light-emission mirror (e.g., second mirror 16 in VCSEL 10) to have a reflectivity greater than 99.9% for light at the operative wavelength.

Extended Cavity Region Thickness

Improved VCSEL performance is achieved by configuring the cavity extension region 26 to have a thickness in the longitudinal (Z) direction that is greater than twice the operative wavelength. In some implementations, the optical thickness of the cavity extension region is less than about twenty times the operative wavelength.

Figure 3:
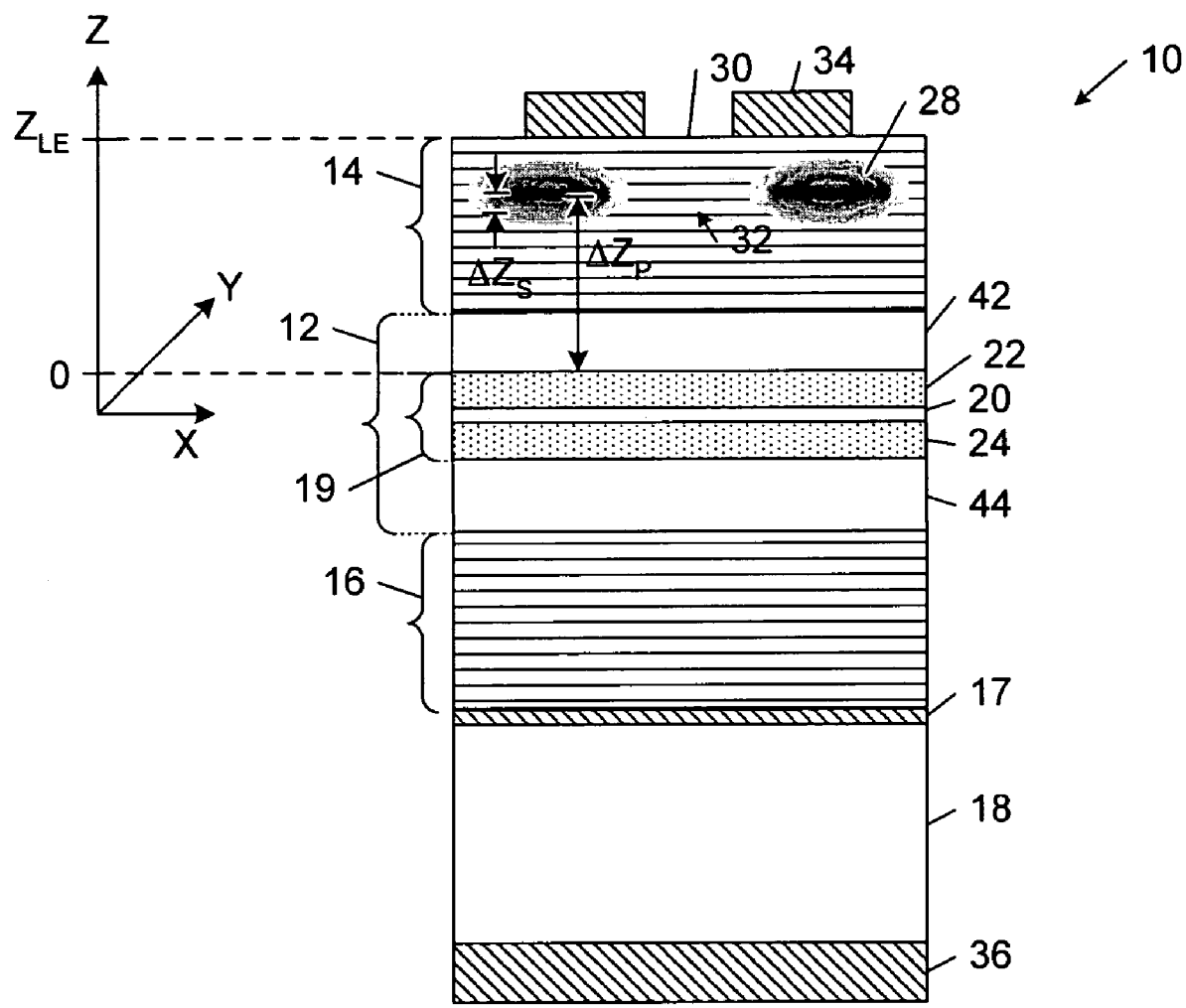
FIG. 3 is a diagrammatic cross-sectional side view of an alternative gain-guided VCSEL that includes a cavity extension region with a first portion adjacent to a first mirror and a second portion adjacent to a second mirror.

As shown in FIG. 3, in some embodiments, the cavity extension region includes a first portion 42 that is adjacent to the first mirror 14 and second portion 44 that is adjacent to the second mirror 16. In other respects, the cavity extension region 42, 44 is the same as the cavity extension region 26 in the VCSEL embodiment of FIG. 1.

II. Exemplary Implementation of VCSEL 10

In some exemplary implementations of VCSEL 10, the active region 19 has an optical thickness in the longitudinal direction substantially equal to the operative wavelength and the cavity extension region 26 has an optical thickness in the longitudinal direction substantially equal to an integral multiple of one-half the operative wavelength in the range of two times the operative wavelength and sixteen times the operative wavelength. The first mirror 14 is a DBR mirror stack that has twenty-one mirror layer pairs that are doped p-type and the second mirror 16 is a DBR mirror stack that has forty mirror layer pairs that are doped n-type. The lasing wavelength is between 780 nm and 850 nm, with a nominal target wavelength of 840 nm. The DBR mirrors 14, 16 are composed of quarter-wave stacks of nominally $Al_{0.2}Ga_{0.8}As$ and $Al_{0.9}Ga_{0.1}As$, respectively. A highly doped contact layer and a current spreader are placed atop the first p-type DBR mirror 14 for good contact and current spreading.

The implant aperture 32 is preferably less than 12 μm in diameter. The opening defined by the p-type electrical contact 34 preferably is less than 10 μm in diameter. In an embodiment in which the implant aperture is about 10 μm in diameter, the opening defined by the p-type electrical contact is about 6 μm in diameter. The n-type electrical contact 34 is placed on the substrate 18. The implant energy for implanting protons to form the current confinement region 28 is 190 keV. A separate, deep implant (25 μm in diameter) is used to limit lateral leakage current through the junction.

Depending on the length of the extended cavity, single-mode lasing in DC (direct current) operation (i.e., the side-mode suppression ratio (SMSR) is greater than 30 dB) is achieved for high bias currents. For example, single-mode light output at more than 2.5 mW has been observed without mode switching at an operating bias of about 9 mA and 2.5 V for a VCSEL with a cavity extension region 26 with a thickness of 10.5 times the operative wavelength and formed of a material corresponding to the first layer of the second, n-type mirror stack 16.

Figure 4:
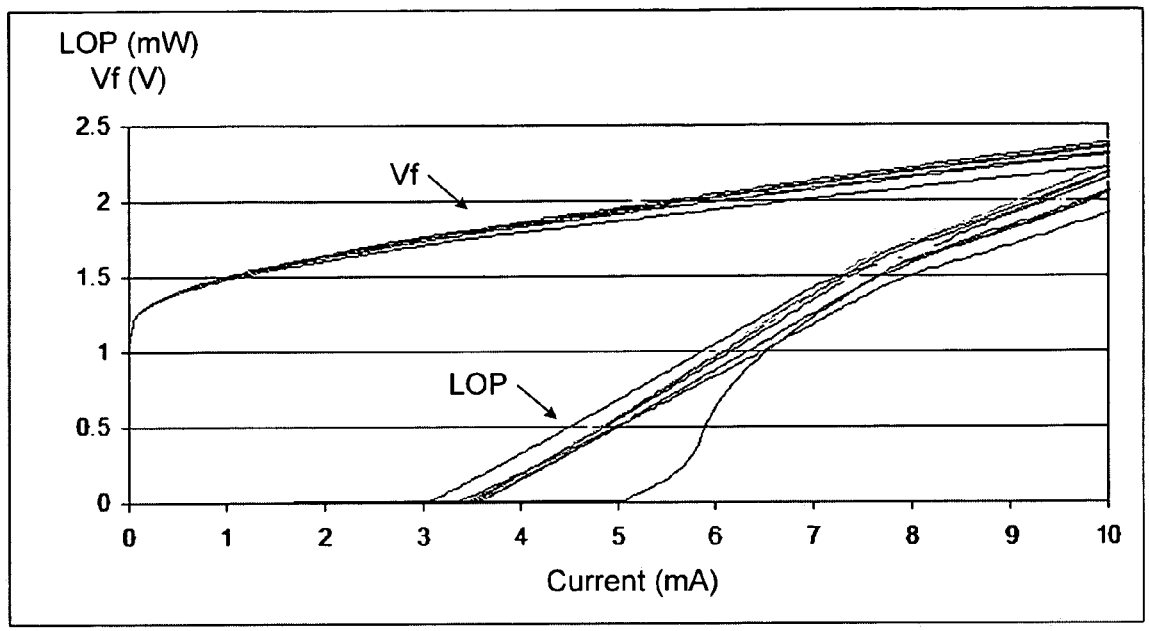
FIG. 4 is a graph of light optical power (LOP) and voltage (V) plotted as a function of forward injection current (current) for different implementations of the VCSEL of FIG. 1.
Figure 5:
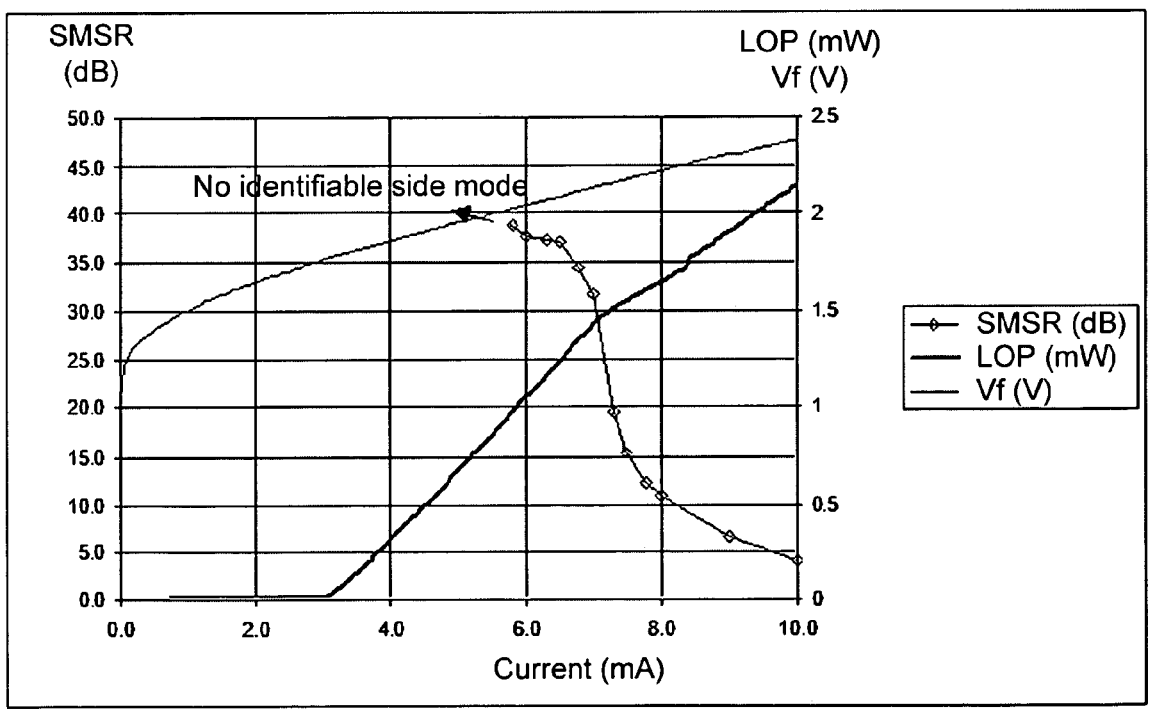
FIG. 5 is a graph of side-mode suppression ratio plotted as a function of bias current for an implementation of the VCSEL of FIG. 1.

FIG. 4 shows a graph of light optical power (LOP) and voltage (V) plotted as a function of forward injection current (current) for different implementations of the exemplary implementation of VCSEL 10. FIG. 5 shows a graph of side-mode suppression ratio plotted as a function of bias current for an implementation of the VCSEL of FIG. 1.

III. Conclusion

In sum, the embodiments described herein feature single-mode vertical cavity surface emitting lasers (VCSELs) that incorporate a set of features configured to improve single-mode output optical power performance. This combination of features counter-intuitively leverages the improved current uniformity of intentionally high leakage currents and lower emission mirror reflectivity, which operate to push out the lasing current threshold, to produce VCSELs with higher single-mode output power. This allows VCSELs with larger current apertures (and consequently lower electrostatic discharge thresholds and lower series resistance) and higher single-mode output optical power to be formed.

Other embodiments are within the scope of the claims. For example.

What is claimed is:

1. A vertical cavity surface emitting laser (VCSEL) operable to generate single-mode laser light at an operative wavelength, comprising:
   a light-emitting surface; and
   a monolithic longitudinal stack structure including
   a first mirror having an optical reflectivity R1 for light at the operative wavelength,
   a second mirror having an optical reflectivity R2 for light at the operative wavelength,
   wherein R1 and R2 have different respective values one of which is greater than 99.9% and another of which is less than 99.7%,
   a cavity region extending from the first mirror to the second mirror and including an active light generation region and a cavity extension region;
   wherein the longitudinal stack structure further includes an ion-implanted current confinement region characterized by a peak longitudinal implant concentration separated from the cavity region by a longitudinal distance greater than 0.5 µm.

2. The VCSEL of claim 1, further comprising a metal contact disposed on the light emitting surface and defining an aperture, wherein the ion-implanted current confinement region defines a current aperture larger than the aperture of the metal contact.

3. The VCSEL of claim 1, wherein both R1 and R2 are at least 99.5%.

4. The VCSEL of claim 1, wherein the cavity extension region has a longitudinal optical thickness greater than twice the operative wavelength.

5. The VCSEL of claim 4, wherein the longitudinal optical thickness of the cavity extension region is less than about twenty times the operative wavelength.

6. The VCSEL of claim 1, wherein each of the first and second mirrors comprises a respective stack of alternating layers of different refractive index materials each having a longitudinal optical thickness substantially equal to one-quarter of the operative wavelength, and the cavity region without the cavity extension region has a longitudinal optical thickness substantially equal to the operative wavelength.

7. The VCSEL of claim 6, wherein the cavity extension region is adjacent to one of the alternating layers of the first and second mirrors.

8. The VCSEL of claim 4, wherein the longitudinal optical thickness of the cavity extension region is substantially equal to an integral multiple of one-half the operative wavelength.

9. The VCSEL of claim 4, wherein the cavity extension region is disposed adjacent to the second mirror and has the same material composition as one of the different refractive index materials in the second mirror stack.

10. The VCSEL of claim 4, wherein the cavity extension region is disposed between the active light generation region and the second mirror.

11. The VCSEL of claim 4, wherein a first portion of the cavity extension region is adjacent to the first mirror and second portion of the cavity extension region is adjacent to the second mirror.

12. The VCSEL of claim 1, wherein the ion-implanted current confinement region is characterized by a longitudinal straggle and the peak longitudinal implant concentration is separated from the cavity region by a longitudinal distance greater than three times the longitudinal straggle.

13. The VCSEL of claim 1, wherein the current confinement region defines a current aperture with a diameter of less than 12 micrometers.

14. An array of two or more vertical cavity surface emitting lasers (VCSELs), each VCSEL comprising:
    a light-emitting surface; and
    a monolithic longitudinal stack structure including
    a first mirror having an optical reflectivity R1 for light at the operative wavelength,
    a second mirror having an optical reflectivity R2 for light at the operative wavelength,
    wherein R1 and R2 have different respective values one of which is greater than 99.9% and another of which is less than 99.7%,
    a cavity region disposed between the first mirror and the second mirror and including an active light generation region and a cavity extension region;
    wherein the longitudinal stack structure further includes an ion-implanted current confinement region characterized by a peak longitudinal implant concentration separated from the cavity region by a longitudinal distance greater than 0.5 µm.

15. A method of manufacturing a vertical cavity surface emitting laser (VCSEL), comprising:
    forming a light-emitting surface and a monolithic longitudinal stack structure, the monolithic longitudinal stack structure including
    a first mirror having an optical reflectivity R1 for light at the operative wavelength,
    a second mirror having an optical reflectivity R2 for light at the operative, wavelength,
    wherein R1 and R2 have different respective values one of which is greater than 99.9% and another of which is less than 99.7%,
    a cavity region extending from the first mirror to the second mirror and including an active light generation region and a cavity extension region;
    implanting ions in an current confinement region characterized by a peak longitudinal implant concentration separated from the cavity region by a longitudinal distance greater than 0.5 µm.

16. The method of claim 15, further comprising forming on the light emitting surface a metal contact defining an aperture, wherein the ion-implanted current confinement region defines a current aperture larger than the aperture of the metal contact.

17. The method of claim 15, wherein the cavity extension region has a longitudinal optical thickness greater than twice the operative wavelength and less than about twenty times the operative wavelength.

18. The method of claim 15, wherein each of the first and second mirrors comprises a respective stack of alternating layers of different refractive index materials each having a longitudinal optical thickness substantially equal to one-quarter of the operative wavelength, and the cavity region without the cavity extension region has a longitudinal optical thickness substantially equal to the operative wavelength.

19. The method of claim 18, wherein the longitudinal optical thickness of the cavity extension region is substantially equal to an integral multiple of one-half the operative wavelength.

20. The method of claim 18, wherein the cavity extension region is disposed adjacent to the second mirror and has the same material composition as one of the different refractive index materials in the second mirror stack.

21. The VCSEL of claim 1, wherein the current confinement region is a damaged region of the longitudinal stack structure.

22. The method of claim 15, wherein the implanting comprises implanting protons in the current confinement region.

23. The VCSEL of claim 1, wherein the ion-implanted current confinement region is in the first mirror.

24. The method of claim 15, wherein the implanting comprises implanting protons in the first mirror.

25. The array of claim 14, wherein the cavity region extends from the first mirror to the second mirror.

* * * * *